United States Patent [19]
Ueda et al.

[11] 3,974,425
[45] Aug. 10, 1976

[54] ISOLATOR CIRCUIT WITH IMPROVED FREQUENCY RESPONSE

[75] Inventors: Toshitsugu Ueda; Shiro Takeuchi, both of Musashino, Japan

[73] Assignee: Yokogawa Electric Works, Ltd., Tokyo, Japan

[22] Filed: Mar. 3, 1975

[21] Appl. No.: 555,193

[30] Foreign Application Priority Data
Mar. 8, 1974 Japan............................ 49-27450[U]

[52] U.S. Cl................................. 317/123; 330/6; 330/165; 330/169
[51] Int. Cl.² ....................................... H03F 15/00
[58] Field of Search ................ 317/123; 330/6, 165, 330/166, 167, 169, 171

[56] References Cited
UNITED STATES PATENTS

| | | | |
|---|---|---|---|
| 3,443,234 | 5/1969 | Bizet | 330/6 |
| 3,828,269 | 8/1974 | Norton | 330/165 X |

*Primary Examiner*—R. N. Envall, Jr.
*Attorney, Agent, or Firm*—Parmelee, Johnson & Bollinger

[57] ABSTRACT

An isolator circuit of the type designed to accept an input current and to generate a corresponding output current which is isolated from the input. The isolator circuit is formed with a core developing a flux in response to the input current and having a feedback winding for carrying the isolated output current. A magneto-sensitive element, such as a Hall effect element, responds to flux in the core, and an amplifier receives the output of the magneto-sensitive element and supplies a current to the feedback winding so as to cancel the flux produced in the core due to the input current. Improved frequency response is attained by means of a compensation winding disposed to respond to the difference between the flux produced by the input current and the flux produced by the output current. The compensation winding is connected in the isolator circuit with the voltage developed across the compensation winding being superposed on the output of the magneto-sensitive element and supplied to the input of the amplifier. The voltage developed across the compensation winding leads the voltage across the magneto-sensitive element and compensates for phase lags arising in the current, thereby extending accurate frequency response of the circuit.

10 Claims, 4 Drawing Figures

ISOLATOR CIRCUIT WITH IMPROVED FREQUENCY RESPONSE

BACKGROUND OF THE INVENTION

1. Field of the Invention

The present invention relates to isolator circuits, i.e., circuits which respond to an input and generate an output varying with but isolated from the input. Such circuits are useful, for example, in the transmission of signals into and out of hazardous areas, where a direct connection could permit dangerous energy levels to pass.

2. Description of the Prior Art

Prior art techniques have evolved various isolators capable of developing an output current isolated from the input. In one such isolator, an input current creates a magnetic flux, and an amplifier develops, by means of the isolated output current, a feedback flux to balance with the input flux. This type of isolator, although serviceable in many applications, is not fully satisfactory because a phase lag takes place in the circuits of the isolator, and an error is likely to be introduced into the output current due to this phase lag when the frequency of the input current is high.

SUMMARY OF THE INVENTION

Accordingly, it is an object of the invention to provide an improved isolator circuit. It is a specific object of the invention to provide an isolator circuit having an improved phase characteristic and thus being capable of producing an isolated output current of accurate value in a wide frequency band. It is a further object of the invention to provide an isolator circuit having an adjustable phase characteristic capable of adaptation to inputs in a wide frequency band. Still another object of the invention is to provide an isolator circuit permitting an isolated output current to be derived without disconnecting the line which is carrying the input current.

In a preferred embodiment of the invention to be described hereinbelow in detail, the isolator circuit is of the type formed with a core developing a flux in response to the input current, and having a feedback winding on which the output current is carried. A magneto-sensitive element, such as a Hall effect device, responds to flux in the core and an amplifier receives the output from the magneto-sensitive element and supplies a current to the feedback winding so as to cancel the flux produced in the core due to the input current. Improved frequency response is obtained in the isolator circuit by means of a compensation winding disposed to respond to the difference flux between the flux produced due to the input current and the flux produced due to the output current. The compensation winding is connected in the isolator circuit with the voltage developed across the compensation winding, which voltage is proportional to the change in difference flux, being superposed on the output of the magneto-sensitive element and supplied to the input of the amplifier. This arrangement is advantageous because the voltage developed across the compensation winding leads the voltage across the magneto-sensitive element and compensates for phase lag arising in the circuit, thereby extending accurate response of the isolator circuit into higher frequencies. This arrangement further is advantageous in that it affords improved phase characteristics relatively inexpensively and with adjustability while maintaining complete signal isolation.

Other objects, aspects and advantages of the invention will be pointed out in, or apparent from, the detailed description hereinbelow, considered together with the following drawings.

DESCRIPTION OF THE PREFERRED EMBODIMENTS

Figure 1:
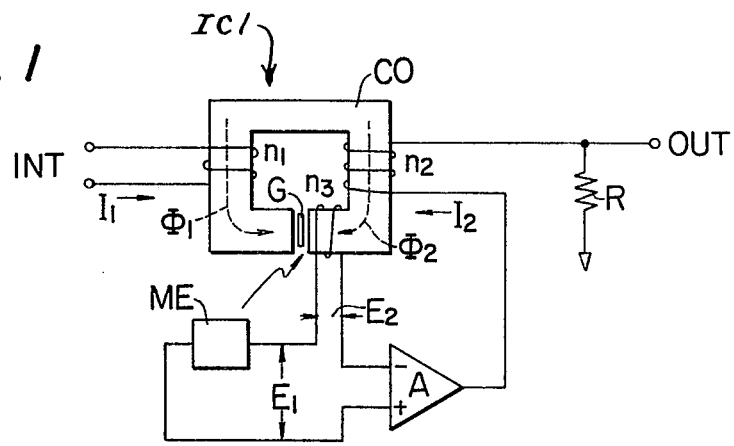
FIG. 1 is a diagram of an isolator circuit constructed according to the invention.

FIG. 1 illustrates an isolator circuit IC1 fashioned in accordance with the present invention, with terminals INT through which an input current $I_1$ is supplied and an output terminal OUT from which an output current $I_2$, isolated from the input current $I_1$ and having an improved frequency characteristic, is derived. The isolator circuit IC1, as shown in FIG. 1, is formed with a square core CO of magnetic material having a gap G, an input winding $n_1$, a feedback winding $n_2$, a winding $n_3$ provided for the purpose of phase compensation, a high gain amplifier A, and a magneto-sensitive element ME, such as a Hall effect element, which is disposed in the gap G. (FIG. 1 shows the single magneto-sensitive element physically disposed in gap G, and schematically as a circuit element in the input circuit of amplifier A.) The windings $n_1$, $n_2$ and $n_3$ are wound on the core CO, with the input winding $n_1$ being connected to the input terminal INT, the feedback winding $n_2$ being connected between the output terminal of the amplifier A and the output terminal OUT, and the phase compensation winding $n_3$ being connected to the input terminals of the amplifier A through the magneto-sensitive element ME.

Isolator circuit IC1 operates in the following manner. When an input current $I_1$ is supplied to winding $n_1$ through the input terminals INT, a flux $\phi_1$ corresponding to the input current $I_1$ is produced in core CO. This flux serves as an input to the magneto-sensitive element ME disposed in the gap G of the core CO and, as a result, a voltage corresponding to the input current $I_1$ is developed across the element ME. The amplifier A amplifies this voltage and produces the output current $I_2$, which flows through the feedback winding $n_2$ to produce a corresponding flux $\phi_2$ in core CO and then is made available at the output terminal OUT as an output current isolated from the input current $I_1$. The negative feedback arrangement of high gain amplifier A causes current $I_2$ to flow in the feedback winding $n_2$ so that the flux $\phi_2$ produced in the core CO by the current $I_2$ flowing in the feedback winding $n_2$ substantially cancels the flux $\phi_1$ produced in the core CO by the input current $I_1$. Because there is then a relationship between the currents $I_1$ and $I_2$ of $I_1 N_1 = I_2 N_2$, where $N_1$ and $N_2$ denote the numbers of turns of the windings $n_1$ and $n_2$ respectively, the isolated output current $I_2$ corresponds to and varies with the value of the input current $I_1$.

Generally, in devices comprising components such as amplifier A and feedback winding $n_2$, a phase lag arises in the amplifier A and winding $n_2$. Hence the phase of the flux $\phi_2$ produced in the core CO by the current flowing in the feedback winding $n_2$ lags further behind the phase of the flux $\phi_1$ produced by the current $I_1$ as the frequency of the input current $I_1$ becomes higher. Accordingly, when a high frequency current is an input to the device, an error is introduced into the output current unless some means is employed to compensate for the frequency characteristic ascribed to the phase lag.

In accordance with the present invention, such frequency compensation is provided by winding $n_3$. To consider the frequency characteristics of isolator circuit IC1, assume that a voltage $E_1$ is produced across the magneto-sensitive element ME due to the flux $\phi$ which is the difference between the fluxes $\phi_1$ and $\phi_2$ produced by input current $I_1$ and output current $I_2$ respectively, and that a voltage $E_2$ is induced across the compensation winding $n_3$ due to the flux $\phi$. Then the two voltages $E_1$ and $E_2$ are given as $$E_1 \propto \phi \qquad (1)$$

$$E_2 \propto \frac{d\phi}{dt} \qquad (2)$$

As is apparent from Esq. (1) and (2), the voltage $E_2$ developed across the compensation winding $n_3$ has a phase which is 90° ahead of the phase of the output voltage $E_1$ produced across the element ME. Thus, as in the arrangement shown in FIG. 1, when the voltage $E_2$ is superposed on the output voltage $E_1$ of the magneto-sensitive element ME and supplied to input of the amplifier A, the phase lags arising in the amplifier A, feedback winding $n_2$, etc. are compensated to minimize the phase difference between the input current $I_1$ and the output current $I_2$ and to improve the frequency characteristic of the device as a whole. Thus, in the device of the present invention, an input current $I_1$ ranging in frequency from direct current up to almost 200 kHz can be isolated and an output current $I_2$ of accurate value can be obtained by suitably selecting or adjusting the constants of the constituent components of isolator circuit IC1.

Figure 2:
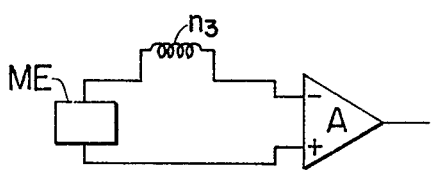
FIG. 2 is a circuit diagram showing a portion of the circuit of FIG. 1.
Figure 3:
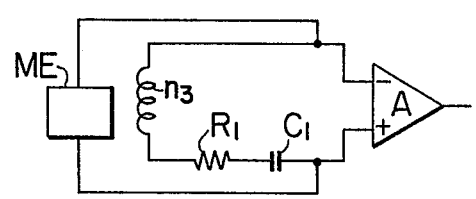
FIG. 3 is a circuit diagram, similar to FIG. 2, showing a modified portion of the circuit.

In the configuration of isolator circuit IC1 shown in FIG. 1, the compensation winding $n_3$ is wound on the core CO. Alternatively, the winding $n_3$ may be installed inside the gap G, together with the magneto-sensitive element ME. Also, as shown in FIG. 1, a resistor R may be connected to the output terminal OUT to enable the output to be taken out as a voltage. In addition, in the embodiment shown in FIGS. 1 and 2 the output $E_2$ of the compensation winding $n_3$ is supplied to the amplifier A in series with the output $E_1$ of the magneto-sensitive element ME. Instead, the output of the compensation winding $n_3$ may be connected in parallel with the output of the magneto-sensitive element ME when these outputs are supplied to the amplifier A, as illustrated in FIG. 3. In this arrangement, the resistor $R_1$ and capacitor $C_1$ are supplied for the purpose of adjusting the phase which is to be compensated.

Figure 4:
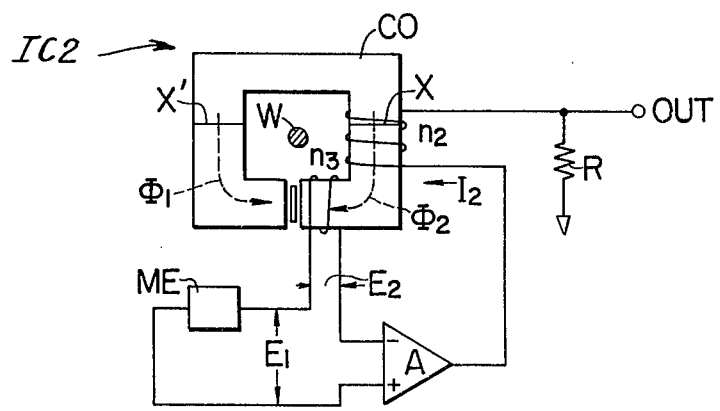
FIG. 4 is a diagram of another isolator circuit according to the invention.

FIG. 4 illustrates another isolator circuit IC2 in accordance with the invention. In this embodiment, a wire W (shown in cross-section) through which an input current is flowing is encircled by the core CO. With isolator circuit IC2, an isolated output current may be obtained without disconnecting the wire W, and without interrupting an operating circuit of which the wire W is a part. As shown in FIG. 4, the core CO is divided into two separable parts at X and X', and the wire W is inserted in the center of the core between the separated parts. Isolator circuit IC2 is operated in the same manner as isolator circuit IC1 in FIG. 1. The flux $\phi_1$ produced in the core CO by the input current $I_1$ flowing in the wire W balances with the flux $\phi_2$ produced in the core CO by the isolated output current $I_2$ flowing in the feedback winding $n_2$. The voltage induced across the compensation winding $n_3$ is superposed on the output of the magneto-sensitive element ME and then applied to input of the amplifier A. By the use of the compensation winding $n_3$, therefore, an output current accurately corresponding to the isolated input current can be obtained in circuit IC2 without disconnecting the wire W through which an input current is flowing.

As has been described in detail, the isolator of the invention has an improved frequency characteristic and offers an output current isolated from the input current given.

Although specific embodiments of the invention have been disclosed herein in detail, it is to be understood that this is for the purpose of illustrating the invention, and should not be construed as necessarily limiting the scope of the invention, since it is apparent that many changes can be made to the disclosed structures by those skilled in the art to meet particular applications.

We claim:

1. In an isolator circuit arranged to receive an input current and to produce a corresponding output current isolated therefrom, the isolator circuit being the type formed wiht a core having an input winding to which the input current is supplied and a feedback winding on which the output current is carried, a magneto-sensitive element responsive to flux in said core, and an amplifier which receives an output from the magneto-sensitive element and supplies a current to said feedback winding so as to cancel the flux produced in the core due to said input current, the improvement which comprises:

a compensation winding disposed to respond to the difference flux between the flux produced due to the input current and the flux produced due to the output current, and means for superposing the voltage signal developed across the output of said compensation winding on the output signal of said magneto-sensitive element and for supplying the superposed signals to the input of said amplifier for development of the output current.

whereby the compensation winding compensates for phase lags arising in the amplifier and feedback winding, thereby extending the frequency response of the isolator circuit.

2. An isolator circuit as claimed in claim 1 wherein said magneto-sensitive element and said compensation winding are connected in series to each other, and the resultant series circuit is connected across the input terminals of said amplifier.

3. An isolator circuit as claimed in claim 1 wherein a resistor, a capacitor and said compensation winding are connected in series to each other, said magneto-sensitive element is connected in parallel to the resultant series circuit, and the resultant parallel circuit is connected across the input terminals of said amplifier.

4. An isolator circuit as claimed in claim 1 wherein said magneto-sensitive element is a Hall effect element.

5. An isolator circuit as claimed in claim 4 wherein the core has a gap, and the Hall effect element is disposed in said gap.

6. An isolator circuit as claimed in claim 1 wherein the current flowing in said feedback winding is supplied to an output resistance element, and the voltage drop produced across the resistance element is taken out as an output.

7. In an isolator circuit arranged to receive an input current and to produce a corresponding output current isolated therefrom, the isolator circuit being of the type formed with a separable core positionable around a wire supplied with an input current and having a feedback winding on which the output current is carried, a magneto-sensitive element responsive to flux in said core, and an amplifier which receives an output from said magneto-sensitive element and supplies a current to said feedback winding so as to cancel the flux produced in the core due to said input current, the improvement which comprises:

a compensation winding disposed to sespond to the difference flux between the flux produced due to the input current and the flux produced due to the output current, and means for superposing the voltage signal developed across the output of said compensation winding on the output signal of said magneto-sensitive element and for supplying the superposed signals to the input of said amplifier for development of the output current, whereby the compensation winding compensates for phase lags arising in the amplifier and feedback winding, thereby extending the frequency response of the isolator circuit.

8. An isolator circuit as claimed in claim 7 wherein said magneto-sensitive element and said compensation winding are connected in series to each other, and the resultant series circuit is connected across the input terminals of said amplifier.

9. An isolator circuit as claimed in claim 7 wherein said magneto-sensitive element is a Hall effect element.

10. An isolator circuit as claimed in claim 9 wherein the core has a gap, and the Hall effect element is disposed in said gap.

* * * * *